United States Patent
Inoue et al.

(10) Patent No.: US 10,559,659 B2
(45) Date of Patent: Feb. 11, 2020

(54) POWER SEMICONDUCTOR DEVICE

(71) Applicant: Mitsubishi Electric Corporation, Chiyoda-ku (JP)

(72) Inventors: Atsufumi Inoue, Tokyo (JP); Seiji Oka, Tokyo (JP); Tsuyoshi Kawakami, Tokyo (JP); Akihiko Furukawa, Tokyo (JP); Hidetada Tokioka, Tokyo (JP); Mutsumi Tsuda, Tokyo (JP); Yasushi Fujioka, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/081,140

(22) PCT Filed: Dec. 21, 2016

(86) PCT No.: PCT/JP2016/088173
§ 371 (c)(1),
(2) Date: Aug. 30, 2018

(87) PCT Pub. No.: WO2017/175426
PCT Pub. Date: Oct. 12, 2017

(65) Prior Publication Data
US 2019/0058037 A1    Feb. 21, 2019

(30) Foreign Application Priority Data
Apr. 6, 2016    (JP) .................... 2016-076360

(51) Int. Cl.
*H01L 29/15* (2006.01)
*H01L 29/06* (2006.01)
(Continued)

(52) U.S. Cl.
CPC ...... *H01L 29/0696* (2013.01); *H01L 21/3205* (2013.01); *H01L 21/768* (2013.01);
(Continued)

(58) Field of Classification Search
CPC ............ H01L 29/0696; H01L 24/26; H01L 29/66325; H01L 29/1608; H01L 29/2003;
(Continued)

(56) References Cited

U.S. PATENT DOCUMENTS 8,716,864 B2 *  5/2014  Zommer .............. B23K 1/20
                                                    257/765
8,963,325 B2 *  2/2015  Lee .................. H01L 23/49866
                                                    257/734
(Continued)

FOREIGN PATENT DOCUMENTS

JP    2007-201247 A    8/2007
JP    2009-194357 A    8/2009
(Continued)

OTHER PUBLICATIONS

International Search Report dated Apr. 4, 2017, in PCT/JP2016/088173 filed Dec. 21, 2016.

*Primary Examiner* — Vu A Vu
(74) *Attorney, Agent, or Firm* — Oblon, McClelland, Maier & Neustadt, L.L.P.

(57) ABSTRACT

A power semiconductor device includes an emitter electrode disposed on a semiconductor substrate and through which a main current flows, a conductive layer that is disposed on the emitter electrode and is not a sintered compact, and a sintered metal layer that is disposed on the conductive layer and is a sintered compact. The sintered metal layer has a size to cover all the emitter electrode in plan view, and has higher heat conductivity than the conductive layer. The power semiconductor device can improve heat dissipation performance and adhesion.

17 Claims, 9 Drawing Sheets

(51) Int. Cl.

| | | |
|---|---|---|
| *H01L 29/12* | (2006.01) | |
| *H01L 23/522* | (2006.01) | |
| *H01L 29/739* | (2006.01) | |
| *H01L 21/3205* | (2006.01) | |
| *H01L 21/768* | (2006.01) | |
| *H01L 23/48* | (2006.01) | |
| *H01L 29/78* | (2006.01) | |
| *H01L 23/00* | (2006.01) | |
| *H01L 29/16* | (2006.01) | |
| *H01L 29/20* | (2006.01) | |
| *H01L 29/66* | (2006.01) | |

(52) U.S. Cl.
CPC ............ *H01L 23/48* (2013.01); *H01L 23/522* (2013.01); *H01L 24/26* (2013.01); *H01L 29/12* (2013.01); *H01L 29/1608* (2013.01); *H01L 29/2003* (2013.01); *H01L 29/66325* (2013.01); *H01L 29/739* (2013.01); *H01L 29/7393* (2013.01); *H01L 29/78* (2013.01); *H01L 2924/01028* (2013.01); *H01L 2924/01079* (2013.01); *H01L 2924/3511* (2013.01)

(58) Field of Classification Search
CPC ... H01L 29/7393; H01L 29/12; H01L 21/768; H01L 29/739; H01L 23/522; H01L 21/3205; H01L 23/48; H01L 29/78; H01L 2924/3511; H01L 2924/01028; H01L 2924/01079
USPC .......................................................... 257/77
See application file for complete search history.

(56) References Cited

U.S. PATENT DOCUMENTS

| | | | |
|---|---|---|---|
| 9,153,525 B2* | 10/2015 | Tanaka | ..................... H01L 24/32 |
| 2015/0035137 A1* | 2/2015 | Nishimoto | ......... B23K 35/3006 |
| | | | 257/712 |
| 2015/0221641 A1 | 8/2015 | Onishi | |
| 2016/0240528 A1* | 8/2016 | Deng | ................ H01L 29/66333 |

FOREIGN PATENT DOCUMENTS

| | | |
|---|---|---|
| JP | 2010-272711 A | 12/2010 |
| JP | 5494559 B2 | 9/2011 |
| JP | 2013-16580 A | 1/2013 |
| JP | 2013-98266 A | 5/2013 |
| JP | 2015-126158 A | 7/2015 |
| JP | 2015-146368 A | 8/2015 |

* cited by examiner

F I G. 6
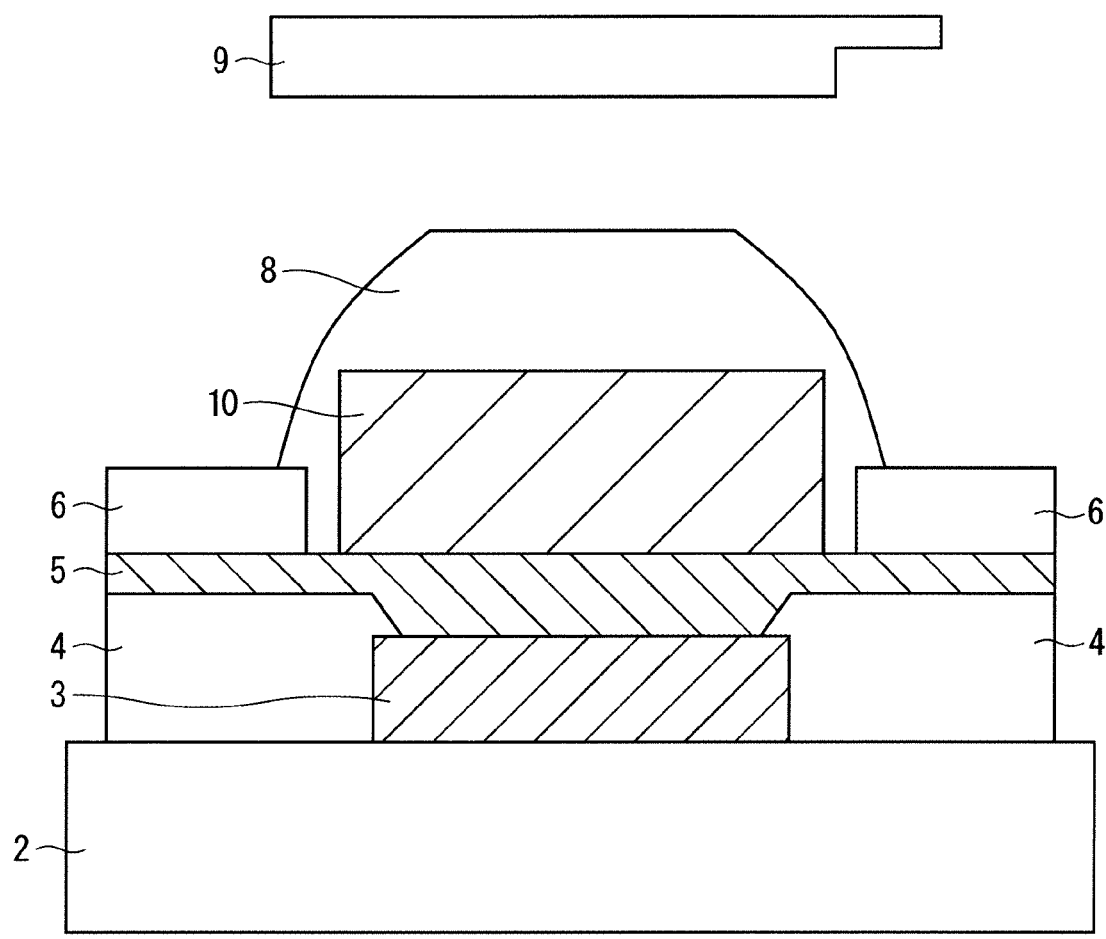

POWER SEMICONDUCTOR DEVICE

TECHNICAL FIELD

The present invention relates to power semiconductor devices.

BACKGROUND ART

Power semiconductor modules include insulated gate bipolar transistor (IGBT) power devices controlling the switching of a large current, and diodes interrupting a reverse current generated during the switching. The power semiconductor modules are widely used in, for instance, home appliances or motor vehicles as main components of power converters.

The power semiconductor modules have been recently used in a severe environment such as a high-temperature environment or an increase in current to be controlled. For use under such a severe environment, the power semiconductor device, such as the IGBT power device needs to have high reliability enough for a long-term normal operation under a use environment where temperature greatly varies. In addition, the power semiconductor device needs to have high heat resistance enough for its operation under high temperature resulting from an increase in heat generated from a semiconductor chip included in the power semiconductor device due to the passage of a large current.

In particular, a die-bonding agent, a joining material containing solder or metal particles, has been conventionally used so that the power semiconductor device is highly resistant to heat. For instance, one technique is disclosed in which heat generated in a semiconductor substrate is dissipated from its back surface through a lead frame (e.g., see Patent Document 1).

Further, in another technique, provided is a semiconductor device including the following: a surface electrode (Al electrode) formed on a surface of a bare chip; a laminated metal layer consisting of Ni-plated and Au-plated layers formed on the surface electrode through electroless plating; and a peripheral pressure-tight structure formed on a side surface of the surface electrode. The semiconductor device is configured such that heat is dissipated from the surface of the bare chip through the laminated metal layer (e.g., see Patent Document 2).

Still further, disclosed is a bump structure consisting of a piece of sintered metal and a piece of solder, and disposed on an electrode (e.g., see Patent Document 3).

PRIOR ART DOCUMENTS

Patent Documents

Patent Document 1: Japanese Patent Application Laid-Open No. 2013-16580
Patent Document 2: Japanese Patent No. 5494559
Patent Document 3: Japanese Patent Application Laid-Open No. 2015-126158

SUMMARY

Problem to be Solved by the Invention

A vehicle-mounted power semiconductor module or any other type of power semiconductor module that needs to be miniaturized involves a large heating value and thus needs to have further improved heat dissipation performance.

Moreover, a power semiconductor module including a wide-bandgap semiconductor such as a SiC semiconductor is available in a wide range of temperature, and thus needs to be reliable at a temperature ranging, for instance, from about −40 to 250° C. Heat dissipation from the back surface of the power semiconductor device is insufficient in order to operate the power semiconductor module under such a condition.

Reference is made to Patent Document 2. Increasing the thicknesses of the Ni-plated and Au-plated layers achieves increased thermal capacity, but involves increased stress, thus producing warpage. The warpage causes damage such as a fracture in the substrate, thus resulting in reduced reliability. For this reason, thick lamination of these layers is difficult to be achieved. Although Patent Document 2 presumes film formation through electroless plating, plated films have a low film-formation rate. Thus, the thick lamination reduces productivity.

Ni has lower heat conductivity than a metal material, such as solder. The IGBT has a short-circuit withstanding capacity of about 10 µs, which is a short-time scale. Hence, Ni, which has lower heat conductivity, fails to achieve sufficient heat dissipation performance. Thus, the thick lamination has a limited heat-dissipation effect. Herein, a short-circuit withstanding capacity means a time period during which an element (e.g., an IGBT) does not break down when switching to ON in a short circuit. Moreover, a thin substrate for reduced losses of the energization and turn-off of the IGBT lowers the heat capacity of the substrate, thus reducing the short-circuit withstanding capacity of the IGBT.

In Patent Document 3, the bump structure, consisting of a piece of sintered metal and a piece of solder and is disposed on the electrode, involves insufficient heat dissipation from a surface electrode. Thus, the short-circuit withstanding capacity does not increase so much. In Patent Document 3, the solder piece is disposed on the electrode. Some conditions for forming the solder piece can cause insufficient adhesion between the electrode and the solder piece.

The present invention has been made to solve these problems. It is an object to provide a power semiconductor device capable of improving heat dissipation performance and adhesion.

Means to Solve the Problem

To solve the problems, the present invention provides a power semiconductor device including the following: a surface electrode disposed on a semiconductor substrate and through which a main current flows; a first metal layer that is disposed on the surface electrode and is not a sintered compact; and at least one second metal layer that is disposed on the first metal layer and is a sintered compact. The second metal layer has a size to cover all the surface electrode in plan view, and has higher heat conductivity than the first metal layer.

Effects of the Invention

According to the present invention, the power semiconductor device includes the following: a surface electrode disposed on a semiconductor substrate and through which a main current flows; a first metal layer that is disposed on the surface electrode and is not a sintered compact; and at least one second metal layer that is disposed on the first metal layer and is a sintered compact. The second metal layer has a size to cover all the surface electrode in plan view, and has higher heat conductivity than the first metal layer. Such a configuration improves the heat dissipation performance and the adhesion.

These and other objects, features, aspects and advantages of the present invention will become more apparent from the following detailed description of the present invention when taken in conjunction with the accompanying drawings.

BRIEF DESCRIPTION OF DRAWINGS

FIG. 6 is a cross-sectional view of further another step for manufacturing the power semiconductor device according to the first embodiment of the present invention.

DESCRIPTION OF EMBODIMENT(S)

Figure 1:
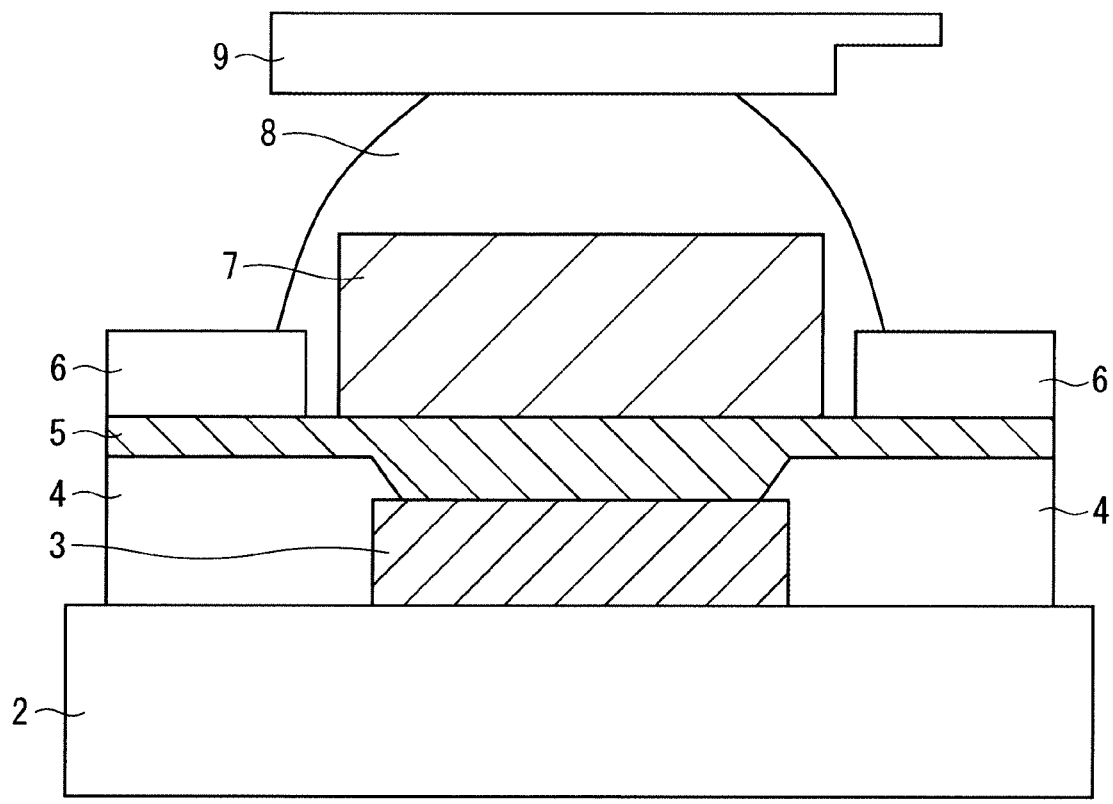
FIG. 1 is a cross-sectional view of a configuration of a power semiconductor device according to a first embodiment of the present invention.

The following describes embodiments of the present invention with reference to the drawings. It is noted that the present invention is not limited to the following description, and is thus changeable as necessary without departing from the gist of the present invention. For easy understanding, the scales of individual components are subject to change from their actual scales in the drawings. This holds true between the individual drawings.

First Embodiment

FIG. 1 is a cross-sectional view of a configuration of a power semiconductor device 1 according to a first embodiment of the present invention.

As illustrated in FIG. 1, the power semiconductor device 1 includes the following: an emitter electrode 3, a surface electrode disposed on a semiconductor substrate 2 and through which a main current flows; an insulating layer 4 provided to cover the semiconductor substrate 2 and part of the emitter electrode 3; a first metal layer (hereinafter referred to as a conductive layer 5) that is provided to cover the emitter electrode 3 and the insulating layer 4, and is not a sintered compact; a second metal layer (hereinafter referred to as a sintered metal layer 7) that is disposed on the conductive layer 5, covers all the emitter electrode 3 in plan view, and is a sintered compact greater than the emitter electrode 3 in plan view; a polyimide layer 6 disposed on the conductive layer 5 so as to be spaced from the sintered metal layer 7; a solder layer 8 provided to cover part of the polyimide layer 6, the sintered metal layer 7, and the conductive layer 5; and a busbar 9 joined on the solder layer 8. A plan view herein means a view of the power semiconductor device 1 viewed from the upper part of FIG. 1 toward the lower part of FIG. 1, and to be specific, a view of the power semiconductor device 1 viewed from the busbar 9 toward the semiconductor substrate 2.

Figure 2:
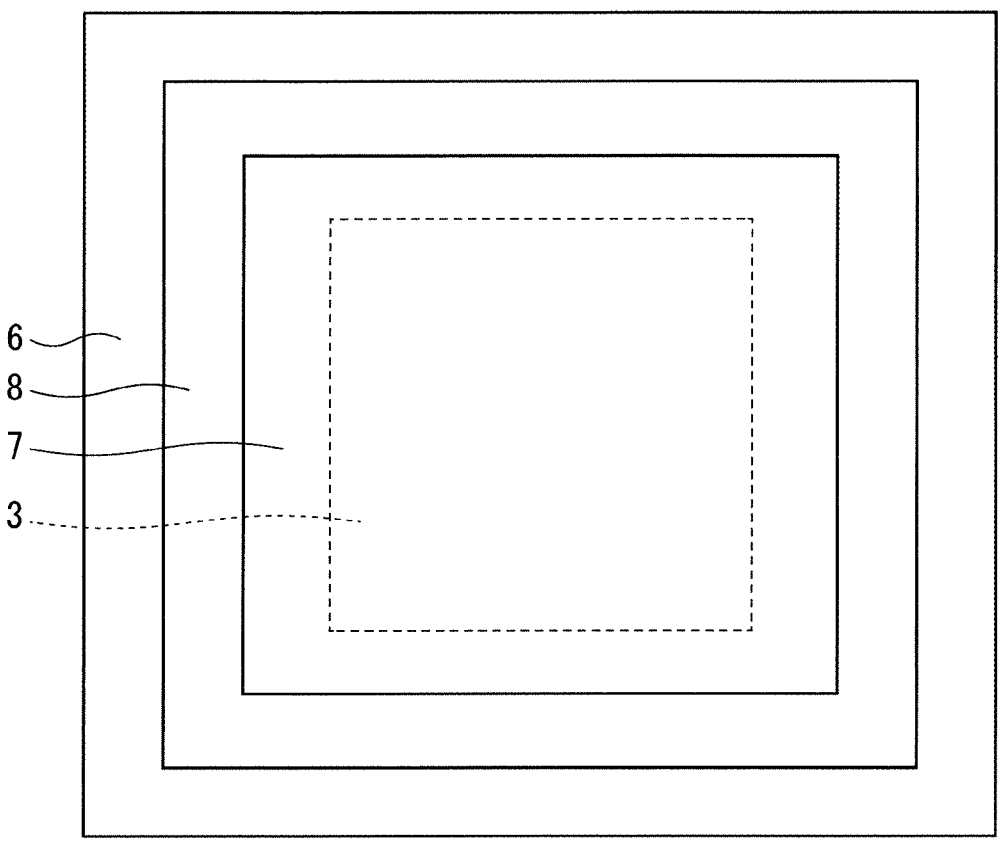
FIG. 2 is a plan view of a positional relationship between an emitter electrode, a polyimide layer, a sintered metal layer, and a solder layer in the power semiconductor device according to the first embodiment of the present invention.

FIG. 2 is a plan view of the power semiconductor device 1 illustrated in FIG. 1. The semiconductor substrate 2, the insulating layer 4, the conductive layer 5, and the busbar 9, which are illustrated in FIG. 1, are omitted in FIG. 2. The emitter electrode 3, although not seen in plan view, is indicated by a broken line for the clarification of its positional relationship with the other components. It is noted that although FIG. 2 illustrates a positional relationship between the emitter electrode 3, the polyimide layer 6, the sintered metal layer 7, and the solder layer 8, the sizes and shapes of the emitter electrode 3, the polyimide layer 6, the sintered metal layer 7, and the solder layer 8 are not limited to what are illustrated in FIG. 2. It is also noted that the language, i.e., the sintered metal layer 7 covers all the emitter electrode 3 and is greater than the emitter electrode 3, encompasses an instance where the sintered metal layer 7 covers only the upper part of the emitter electrode 3.

Each of FIGS. 3 to 6 is a cross-sectional view of a step for manufacturing the power semiconductor device 1.

Figure 3:
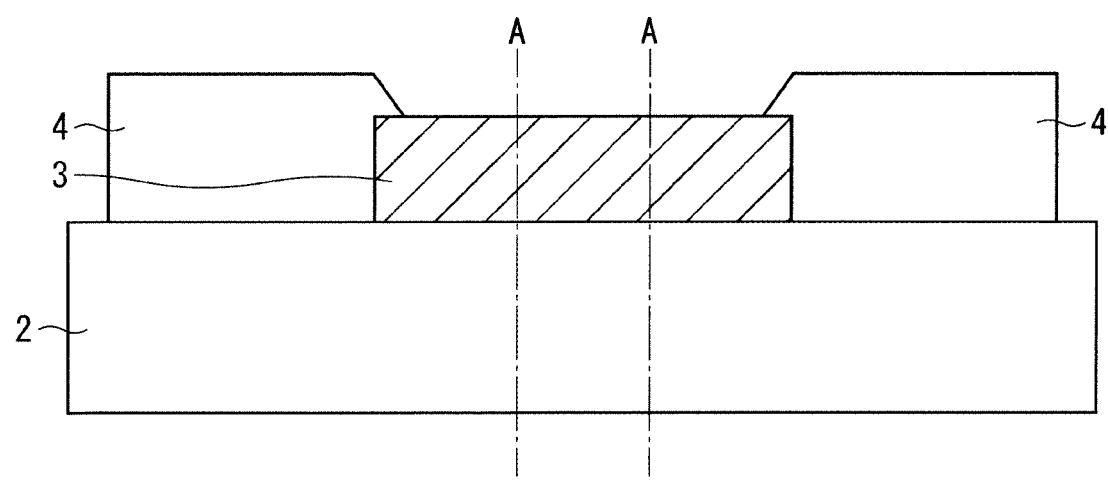
FIG. 3 is a cross-sectional view of a step for manufacturing the power semiconductor device according to the first embodiment of the present invention.

It is noted that prior to the step in FIG. 3, the semiconductor substrate 2 undergoes a process to have an active region (not shown) formed by implanting an impurity in a predetermined region on a surface of the semiconductor substrate 2, and a terminal region (not shown) formed by implanting an impurity in a region around the active region.

In FIG. 3, the emitter electrode 3 is formed onto the active region of the semiconductor substrate 2. The insulating layer 4 is subsequently formed so as to cover part of the emitter electrode 3 and the terminal region of the semiconductor substrate 2. The emitter electrode 3 may be made of Al for instance. The insulating layer 4 may be a SiN layer for instance, formed through a process, such as chemical vapor deposition (CVD).

Figure 4:
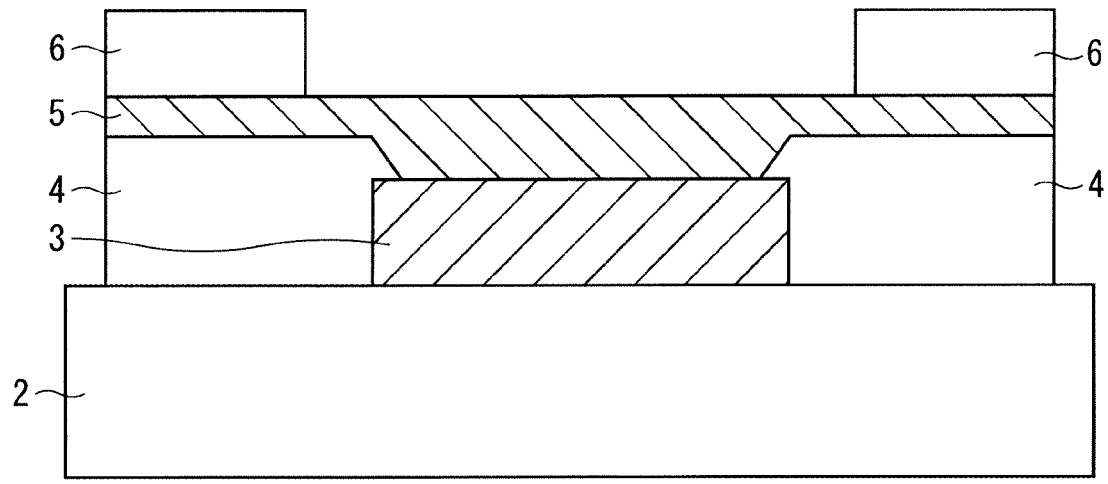
FIG. 4 is a cross-sectional view of another step for manufacturing the power semiconductor device according to the first embodiment of the present invention.

In FIG. 4, the conductive layer 5 is formed onto an active region of the emitter electrode 3 and the insulating layer 4. The active region of the emitter electrode 3 herein means a region of the emitter electrode 3, the region corresponding to the active region of the semiconductor substrate 2. The conductive layer 5 covers all the emitter electrode 3 in plan view, and has a size to be exposed from the end of the emitter electrode 3 in plan view. The polyimide layer 6 is subsequently formed in a position on the conductive layer 5, the position not overlapping the emitter electrode 3 in plan view. That is, the polyimide layer 6 is formed in the terminal region of the semiconductor substrate 2, in a position spaced from a conductive paste 10 that will be formed onto the conductive layer 5 in a subsequent step.

The conductive layer 5 may be made of Ni, Au, an alloy of Ni, or an alloy of Au all of which are formed through, for instance, sputtering or vapor deposition. The conductive layer 5 herein is a piece of metal that does not undergo baking into a sintered compact in a subsequent step; that is, the conductive layer 5 is a piece of metal other than a sintered compact. The conductive layer 5 is a compact layer, and desirably has a porosity (also referred to as a void volume or a void rate) of 1% or less. Ni prevents a sintered metal, a sintered compact, from diffusing into the emitter electrode 3 (e.g., Al). Moreover, some formation conditions can cause insufficient adhesion of a joint between the emitter electrode 3 and a solder layer (a solder layer 8, which will be described later on). Forming Ni between the emitter electrode and the solder layer establishes firm adhesion between the Ni and the emitter electrode, and forms an alloy of the Ni and the solder, thus establishing firm adhesion between the Ni and the solder layer. This enhances adhesion between the emitter electrode 3 and the solder layer 8, and adhesion between the sintered metal layer 7 and the emitter electrode 3.

Au is resistant to oxidation and is thus rust proof even when exposed to air. In the present embodiment, the conductive layer 5, which is covered by the polyimide layer 6, the sintered metal layer 7, and the solder layer 8, is unlikely to be exposed to the air even when the conductive layer 5 contains Ni alone. However, erosion in the solder layer 8 resulting from age deterioration or other factors causes the conductive layer 5, covered by the solder layer 8, to be exposed to the air to thus produce rust. This can advance the degradation of the power semiconductor device 1. Accordingly, the conductive layer 5 desirably has a surface provided with a Au-containing portion in which the conductive layer 5 and the solder layer 8 are immediately joined to each other. The conductive layer 5 does not need to be thick, and may have a thickness of 1 μm or less for instance.

Figure 5:
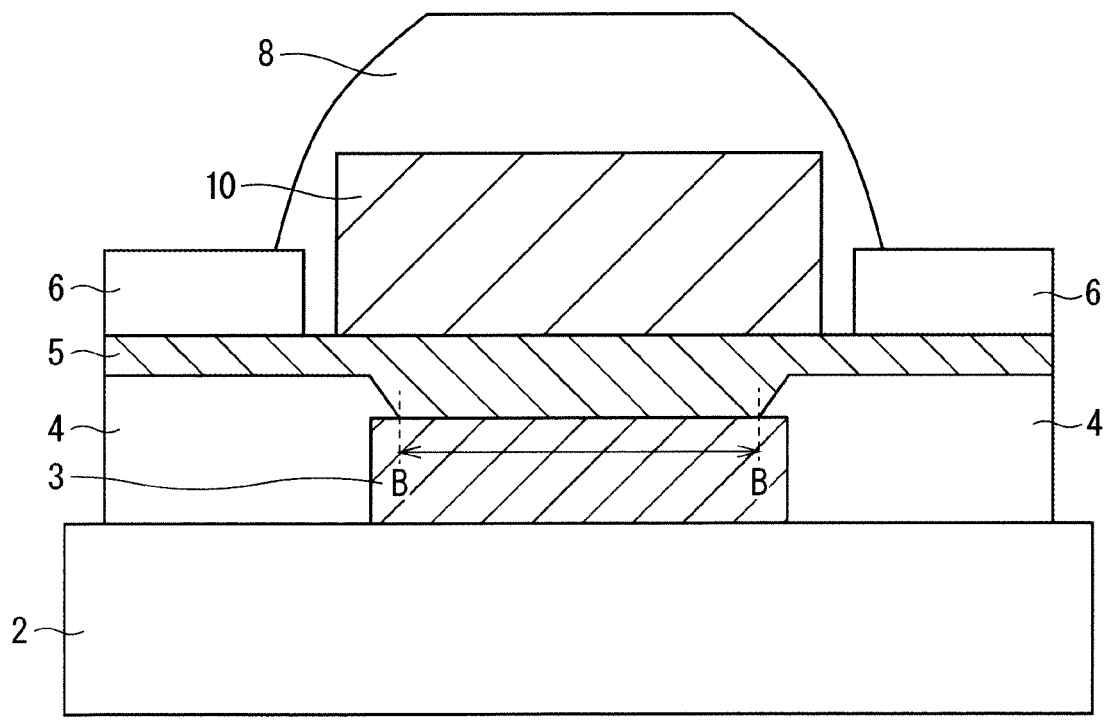
FIG. 5 is a cross-sectional view of still another step for manufacturing the power semiconductor device according to the first embodiment of the present invention.

In FIG. 5, the conductive paste 10 is formed onto the conductive layer 5 so as, in plan view, to be exposed from the end of the emitter electrode 3, to have a size to cover the emitter electrode 3, and not to be in contact with the polyimide layer 6. The solder layer 8 is subsequently formed so as to cover the conductive paste 10, the conductive layer 5, and part of the polyimide layer 6. It is noted that the solder layer 8 may be formed so as to cover all the polyimide layer 6. The conductive paste 10 is made of metal, such as Cu or Ag.

The conductive paste 10 undergoes baking into the sintered metal layer 7 in a subsequent step. Sintered metals, which have high heat conductivity and low stress, are formed to be thick and thus have additional thermal capacity. This improves the heat dissipation performance of an element surface. The sintered metal layer 7 is formed to completely cover the emitter electrode 3 in plan view. This enhances transitional heat-dissipation performance and increases short-circuit withstanding capacity that is a time period before the flow of an overcurrent resulting from thermal runaway when the power semiconductor device 1 is short-circuited. Transitional heat dissipation herein means heat dissipation during a time period before the overcurrent flow resulting from the thermal runaway when the power semiconductor device 1 is short-circuited.

Figure 8:
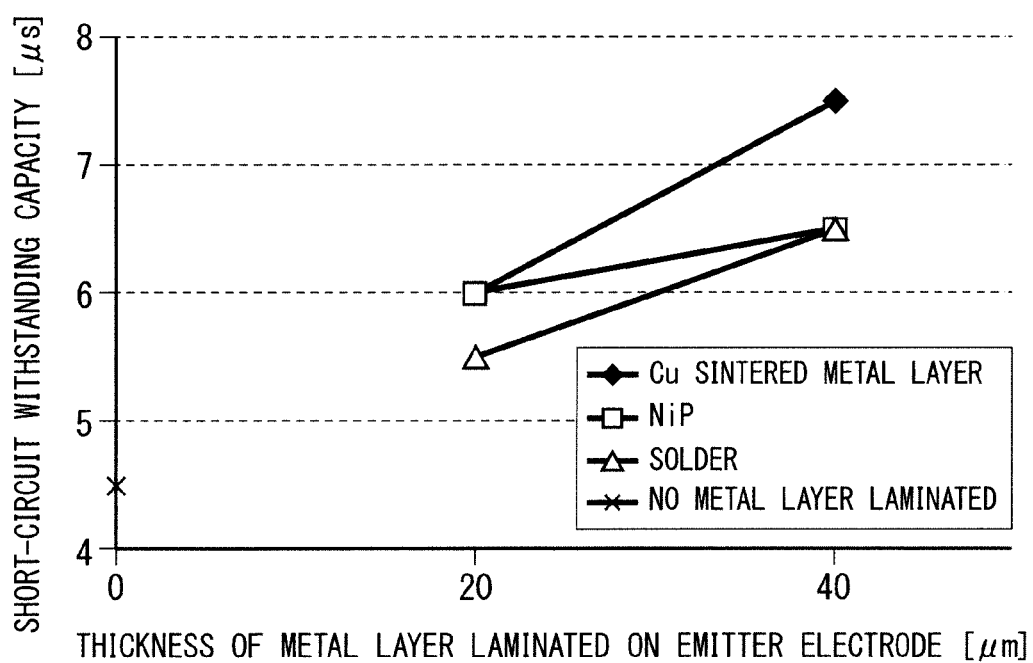
FIG. 8 is a graph showing a relationship between the thickness of a metal layer laminated on the emitter electrode and short-circuit withstanding capacity, according to the first embodiment of the present invention.

FIG. 8 illustrates a relationship between the thickness of each metal layer laminated on the emitter electrode 3 and the short-circuit withstanding capacity, and is a graph showing the results of a simulation using a calculator. FIG. 8 provides the following instances: the emitter electrode 3 is exposed to air (thermal capacity: 0.01 J/cm$^3$·K, heat conductivity: 0.0003 W/cm·K) as one example of no metal layer laminated thereon; a Cu sintered metal layer (thermal capacity: 2.71 J/cm$^3$·K, heat conductivity: 1.8 W/cm·K) is disposed on the emitter electrode 3; a NiP metal layer (thermal capacity: 3.42 J/cm$^3$·K, heat conductivity: 0.05 W/cm·K) is disposed on the emitter electrode 3; and a solder layer (thermal capacity: 1.74 J/cm$^3$·K, heat conductivity: 0.64 W/cm·K) is disposed on the emitter electrode 3. The thicknesses of each metal layer laminated on the emitter electrode 3 are 20 μm and 40 μm. It is noted that the Cu sintered metal layer means a sintered metal layer formed by baking the conductive paste 10 made of Cu. The Cu sintered metal layer is also referred to as a Cu sintered compact. NiP is one example of plating metals.

As seen from FIG. 8, the short-circuit withstanding capacity is 4.5 μs when no metal layer is laminated on the emitter electrode 3 (herein in the case of the air). Reference is made to a 20 μm thick metal layer laminated on the emitter electrode 3. The short-circuit withstanding capacity is 5.5 μs for the solder layer, and is 6.0 μs for the sintered metal layer and the NiP metal layer. Thus, the short-circuit withstanding capacity in the sintered metal layer with a thickness of 20 μm or the NiP metal layer with a thickness of 20 μm, laminated on the emitter electrode 3, is greater than that in the air or the solder layer.

Reference is now made to a 40 μm thick metal layer laminated on the emitter electrode 3. The short-circuit withstanding capacity is 6.5 μs for the NiP metal layer and the solder layer, and is 7.5 μs for the Cu sintered metal layer. Thus, the short-circuit withstanding capacity in the Cu sintered metal layer with a thickness of 40 μm laminated on the emitter electrode 3 is greater than that in the air, the solder layer, or the NiP metal layer.

Figure 9:
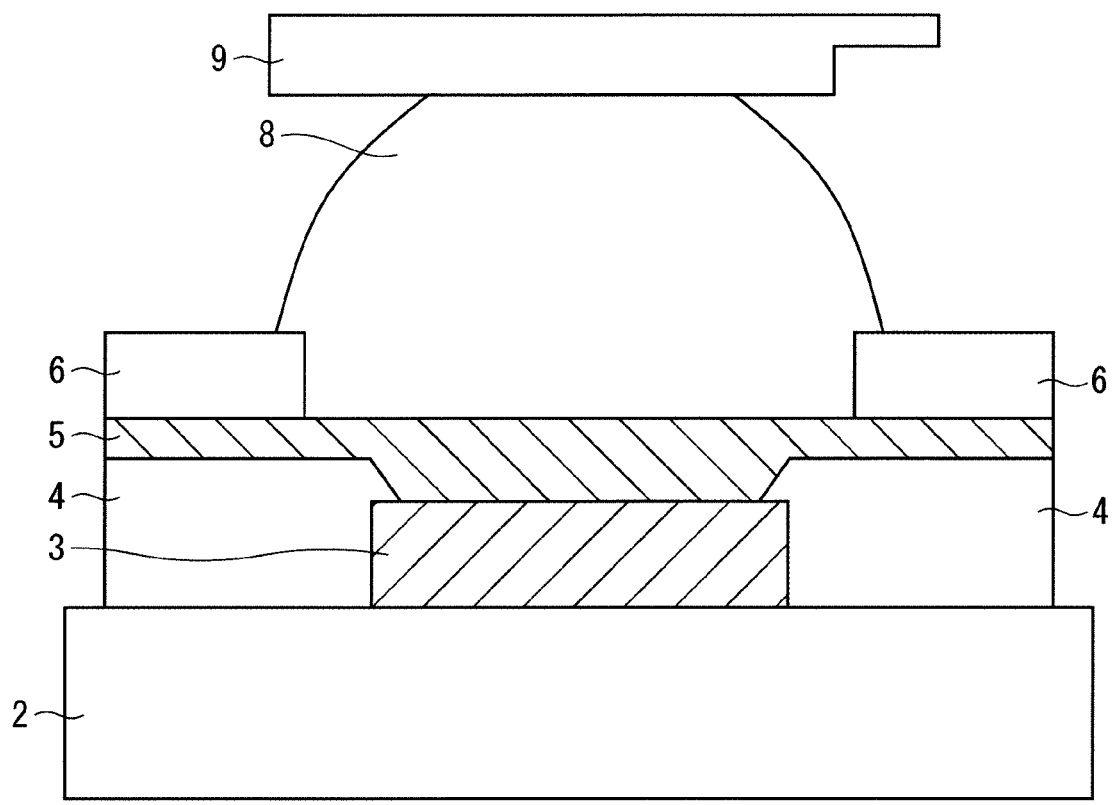
FIG. 9 is a cross-sectional view of a configuration of a power semiconductor device according to a comparative example.

The graph has revealed that an effect achieved by laminating the NiP metal layer onto the emitter electrode 3 through plating decreases once its thickness is more than 20 μm. In addition, the power semiconductor device 1 (c.f., FIG. 1) according to the first embodiment, in which the sintered metal layer 7 made of Cu is laminated, has more short-circuit withstanding capacity than a power semiconductor device in which a solder layer alone is laminated between the busbar 9 and the conductive layer 5 as illustrated in FIG. 9. It is noted that although the embodiment takes the Cu sintered metal layer as one example, a Ag sintered metal layer (thermal capacity: 2.00 J/cm$^3$·K, heat conductivity: 2.4 W/cm·K) brings a similar effect. As seen from the above, a sintered metal layer is more effective in laminating a thick metal layer in order to increase the short-circuit withstanding capacity. It is noted that to improve the short-circuit withstanding capacity for certain, the sintered metal layer is desirably laminated throughout a surface directly on the active region of the emitter electrode 3 indicated by line B-B in FIG. 5, because the short-circuit withstanding capacity is specified in a location where the thermal runaway of current occurs at the earliest time. It is also noted that the Ag sintered metal layer means a sintered metal layer formed by baking the conductive paste 10 made of Ag. The Ag sintered metal layer is also referred to as a Ag sintered compact.

Referring back to steps for manufacturing the power semiconductor device 1, in FIG. 6, the busbar 9 is joined onto the solder layer 8, followed by pressure application and heating. At this stage, the conductive paste 10 is baked into the sintered metal layer 7. Though these steps, the power semiconductor device 1 illustrated in FIG. 1 is completed.

Figure 7:
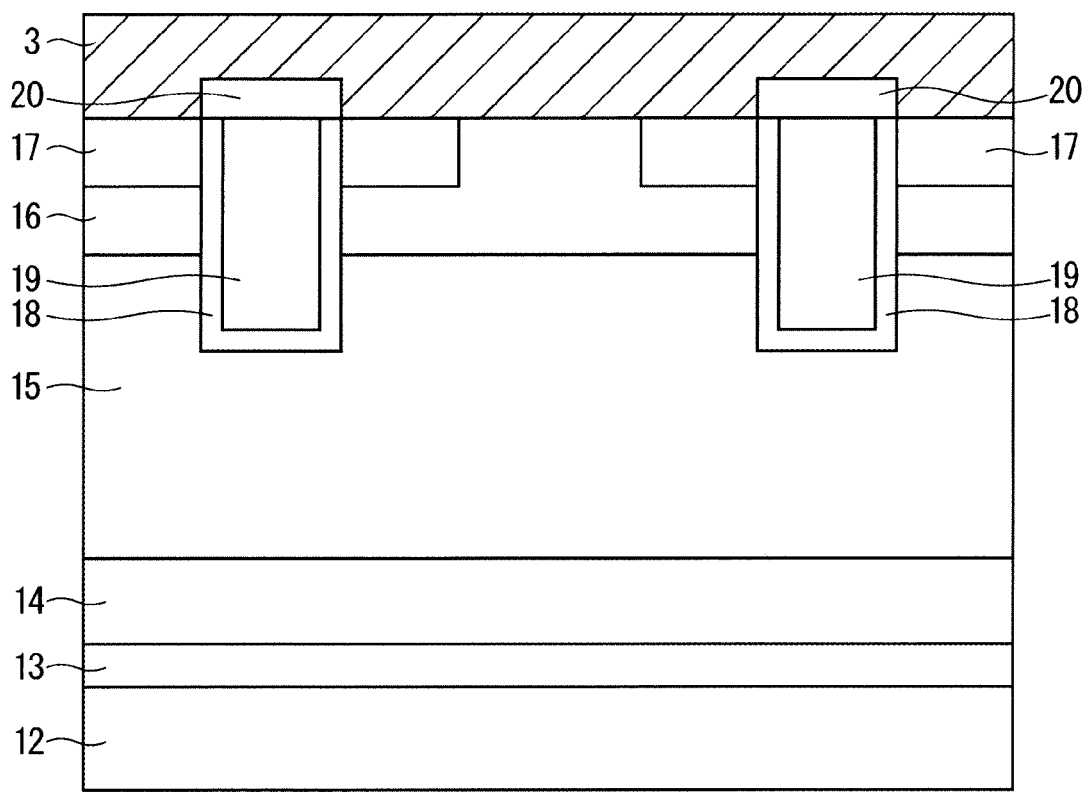
FIG. 7 is a cross-sectional view of a configuration of an IGBT according to the first embodiment of the present invention.

FIG. 7 is a cross-sectional view of a configuration of IGBT 11. The IGBT 11 is mountable on the power semiconductor device 1 (a portion indicated by line A-A in FIG. 3).

As illustrated in FIG. 7, laminated on a collector electrode 12 are, in sequence, a p-type collector layer 13, an n-type buffer layer 14 (the n-type buffer layer 14 may be part of an n-type drift layer 15), the n-type drift layer 15, a p-type base layer 16 that is a p-type impurity layer, and an n-type emitter layer 17 that is an n-type impurity layer having high concentration. The p-type collector layer 13, the n-type buffer layer 14, and the n-type drift layer 15 contain Si.

Trench gates 19 whose peripheries are each covered with a gate oxide film 18 are provided to extend through the n-type emitter layer 17 and the p-type base layer 16 to the n-type drift layer 15. The trench gates 19 each contain polysilicon for instance. The trench gate 19 and the gate oxide film 18 have upper surfaces (front surfaces) covered with an interlayer insulating film 18 made of a material, such as silicon oxide. The emitter electrode 3 is provided to cover the p-type base layer 16, the n-type emitter layer 17, and the interlayer insulating film 20.

In the manufacture of the power semiconductor device 1 provided with the IGBT 11, the IGBT 11 illustrated in FIG. 7 is firstly produced, followed by the steps illustrated in FIGS. 3 to 6 in sequence. This provides the power semiconductor device 1 illustrated in FIG. 1. It is noted that the emitter electrode 3 and a gate electrode (not shown) are provided in plan view when the power semiconductor device 1 includes the IGBT 11. The present invention is directed to the emitter electrode 3 having a larger area than the gate electrode.

According to the first embodiment, the sintered metal layer 7, which has high heat conductivity and low stress, is formed to be thick and thus has additional thermal capacity. This improves the heat dissipation performance of the element surface. The conductive layer 5 is disposed between the emitter electrode 3 and the solder layer 8. Such a configuration enhances the adhesion between the emitter electrode 3 and the solder layer 8, and the adhesion between the sintered metal layer 7 and the emitter electrode 3. In addition, the sintered metal layer 7 is provided to cover the emitter electrode 3 in plan view. Such a configuration enhances the heat dissipation performance (transitional heat-dissipation performance) when the power semiconductor device is short-circuited.

Second Embodiment

Figure 10:
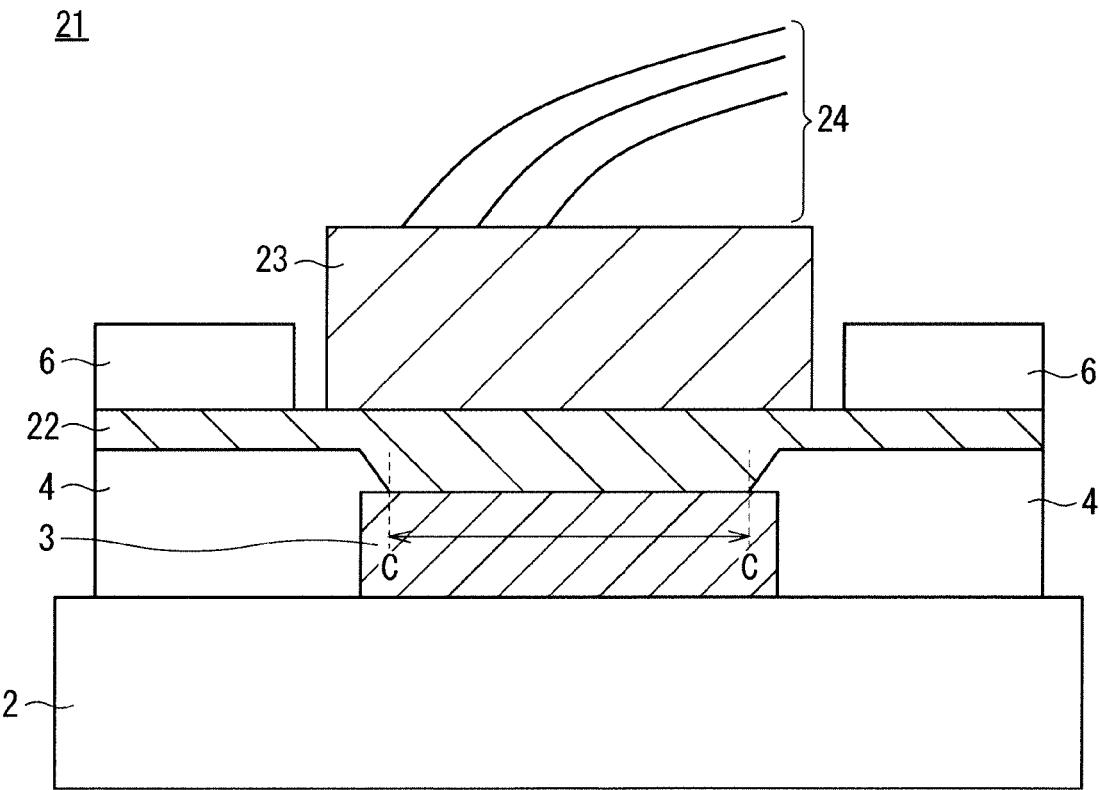
FIG. 10 is a cross-sectional view of a configuration of a power semiconductor device according to a second embodiment of the present invention.

FIG. 10 is a cross-sectional view of a configuration of a power semiconductor device 21 according to a second embodiment of the present invention.

As illustrated in FIG. 10, the power semiconductor device 21 according to the second embodiment includes the following: a conductive layer 22, a first metal layer made of Cu; a sintered metal layer 23, a second metal layer formed by baking a conductive paste made of Cu; and wires 24 bonded on the sintered metal layer 23 and made of Cu. The other components, which are similar to those of the power semiconductor device 1 (c.f., FIG. 1) according to the first embodiment, will not be elaborated upon here.

Wire bonding requires an object to be connected to wires to have certain strength. Accordingly, the wires 24 are directly connected to the sintered metal layer 23 having high strength in the second embodiment. Further, the conductive layer 22 is provided as a base layer of the sintered metal layer 23 in order to increase adhesion between the sintered metal layer 23 and the base layer for enhanced reliability.

The conductive layer 22 needs to be formed through a process, such as screen printing or plating. The conductive layer 22 does not need to be thick, and may have a thickness of 1 μm or less for instance.

The sintered metal layer 23, which has high heat conductivity and low stress, is formed to be thick and thus has additional thermal capacity. This improves the heat dissipation performance of an element surface. An effect achieved by forming the sintered metal layer 23 onto the emitter electrode 3 is the same as that described in the first embodiment (FIG. 5).

It is noted that to improve short-circuit withstanding capacity for certain, the sintered metal layer 23 is desirably laminated throughout a surface directly on an active region of the emitter electrode 3 indicated by line C-C in FIG. 10, because the short-circuit withstanding capacity is specified in a location where the thermal runaway of current occurs at the earliest time.

Like the first embodiment, the IGBT 11 (c.f., FIG. 7) is mountable on the power semiconductor device 21.

According to the second embodiment, the sintered metal layer 23, which has high heat conductivity and low stress, is formed to be thick and thus has additional thermal capacity. This improves the heat dissipation performance of the element surface. The conductive layer 22 is disposed between the emitter electrode 3 and the sintered metal layer 23. Such a configuration enhances adhesion between the emitter electrode 3 and the sintered metal layer 23. In addition, the sintered metal layer 23 is provided to cover the emitter electrode 3 in plan view. Such a configuration enhances the heat dissipation performance (i.e., transitional heat-dissipation performance) when the power semiconductor device is short-circuited.

Third Embodiment

As described in the first and second embodiments, a conductive paste is desirably formed so as to cover an emitter electrode in plan view. However, some patterns of a power semiconductor device or some methods for manufacturing the power semiconductor device can prevent the conductive paste from being formed directly onto the end of the emitter electrode 3. Moreover, a conductive layer and a sintered metal layer, when having the same width, are formed through a process step, such as two-time screen printing. This facilitates device manufacture. A third embodiment describes a power semiconductor device capable of improving heat dissipation performance and enhancing short-circuit withstanding capacity even in such a case.

Figure 11:
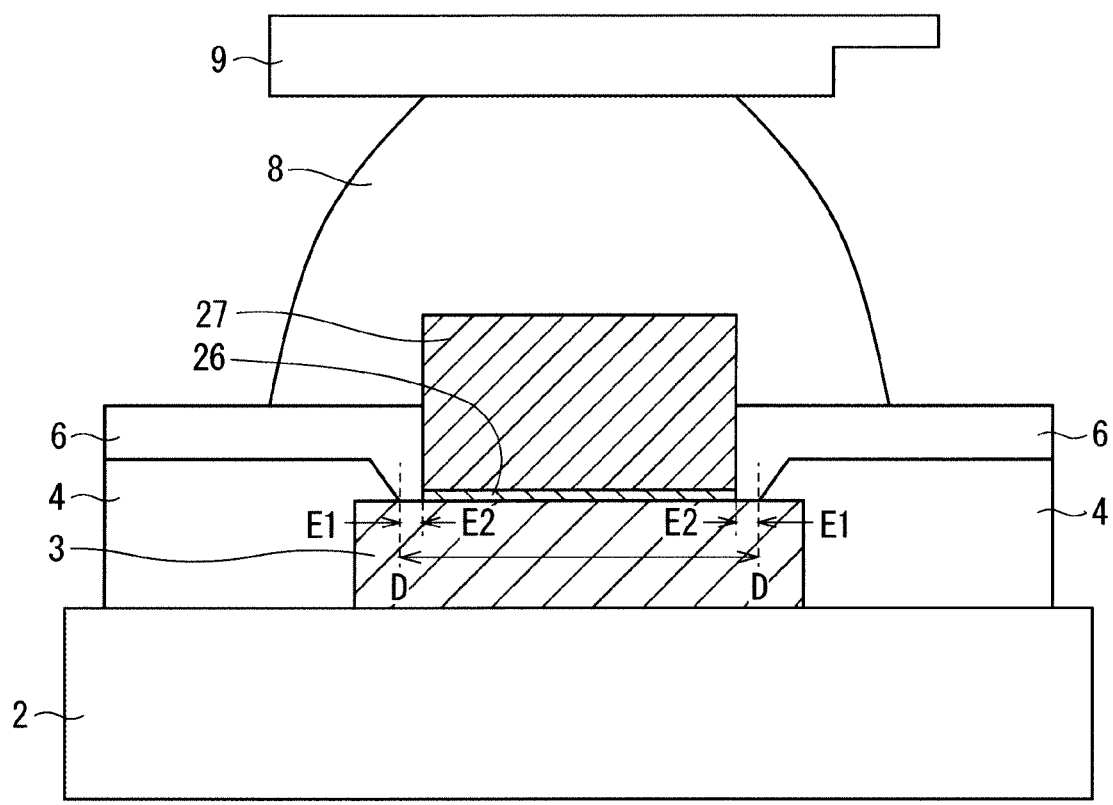
FIG. 11 is a cross-sectional view of a configuration of a power semiconductor device according to a third embodiment of the present invention.

FIG. 11 is a cross-sectional view of a configuration of a power semiconductor device 25 according to the third embodiment of the present invention.

In the power semiconductor device 25 according to the third embodiment, the polyimide layer 6, a conductive layer 26, and a sintered metal layer 27 are disposed in a location different from that of the corresponding components included in the power semiconductor device according to the first embodiment. The other components, which are similar to those in the first embodiment, will not be elaborated upon here.

In FIG. 11, a region indicated by line D-D (hereinafter referred to as a D-D region) is an active region of the emitter electrode 3. Regions indicated by line E1-E2 (hereinafter referred to as E1-E2 regions) are each a region having no conductive layer 26 and no sintered metal layer 27, in the active region of the emitter electrode 3. E1 represents the position of a boundary between the active region and a terminal region. E2 represents the position of the ends of the conductive layer 26 and the sintered metal layer 27.

A large E1-E2 region reduces the heat dissipation performance and produces the thermal runaway of current earlier than the other regions of the D-D region, thereby possibly reducing the short-circuit withstanding capacity. Heat generated in the E1-E2 region, which diffuses into a region having high heat conductivity, diffuses into the outside by way of a surface of the E1-E2 region because the polyimide layer 6 with low heat-dissipation performance is disposed directly on the E1-E2 region. The surface of the E1-E2 region communicates with the conductive layer 26 and the sintered metal layer 27 that are laminated on the emitter electrode 3, and with the terminal region. Heat dissipation from the conductive layer 26 and the sintered metal layer 27, which are metal layers, is predominant in heat conductivity. To successfully dissipate the heat within a transitional time period, a time period after the beginning of a short circuit until thermal-runaway occurrence, heat generated at E1, the furthest position from the conductive layer 26 and the sintered metal layer 27 in the E1-E2 region, needs to reach E2, a position where the sintered metal layer 27 with high heat-dissipation performance (i.e., with high heat conductivity and large thermal capacity) is formed, within the transitional time period.

As illustrated in FIG. 8, all the three kinds of metal layers laminated on the emitter electrode 3 increases the short-circuit withstanding capacity along with an increase in thickness of each metal layer from 0 to 40 μm. This fact indicates that the increase in thickness lengthens a heat dissipation path and also enhances transitional heat dissipation.

Although not shown in FIG. 8, a gradual increase in thickness of each metal layer, laminated on the emitter electrode 3, from 0 to 40 μm equates with a gradual increase in short-circuit withstanding capacity. Al, constituting the emitter electrode 3, has a heat conductivity of about 2.36 W/cm·K. This heat conductivity is 40 times or more as large as that of NiP, and is 80% or more as large as that of a sintered metal layer formed by baking a conductive paste made of Cu. Thus, increasing the thicknesses of the emitter electrode 3 and the sintered metal layer 27 at least from 0 to 40 μm establishes a 40 μm thick path for the transitional heat dissipation. That is, if a distance across the E1-E2 region falls within the thickness of a metal layer laminated in a region except the E1-E2 region within the D-D region, the laminated metal layer improves the short-circuit withstanding capacity.

The following describes steps for manufacturing the power semiconductor device 25.

The emitter electrode 3 and the insulating layer 4 are formed onto a surface of the semiconductor substrate 2. The conductive layer 26 that has a size to cover the active region of the emitter electrode 3 (the D-D region) in plan view is subsequently formed onto the emitter electrode 3.

The polyimide layer 6 is subsequently formed so as to cover the insulating layer 4, and a region having no conductive layer 26 (the E1-E2 region), in the active region of the emitter electrode 3.

The conductive paste having the same width as the conductive layer 26 in plan view is subsequently formed onto the conductive layer 26. The solder layer 8 is subsequently formed so as to cover the conductive paste and part of the polyimide layer 6. It is noted that the solder layer 8 may be formed so as to cover all the polyimide layer 6. At this stage, the ends of the conductive layer 26 and the conductive paste correspond, in plan view, to a position spaced from the position of E1 toward the D-D region by a distance smaller than or equal to the thickness of the conductive paste (i.e., these ends correspond to the position of E2).

The busbar 9 is finally joined onto the solder layer 8. Then, pressure application and overheating are performed. At this stage, the conductive paste is baked into the sintered metal layer 27. Through these steps, the power semiconductor device 25 illustrated in FIG. 11 is completed.

Figure 12:
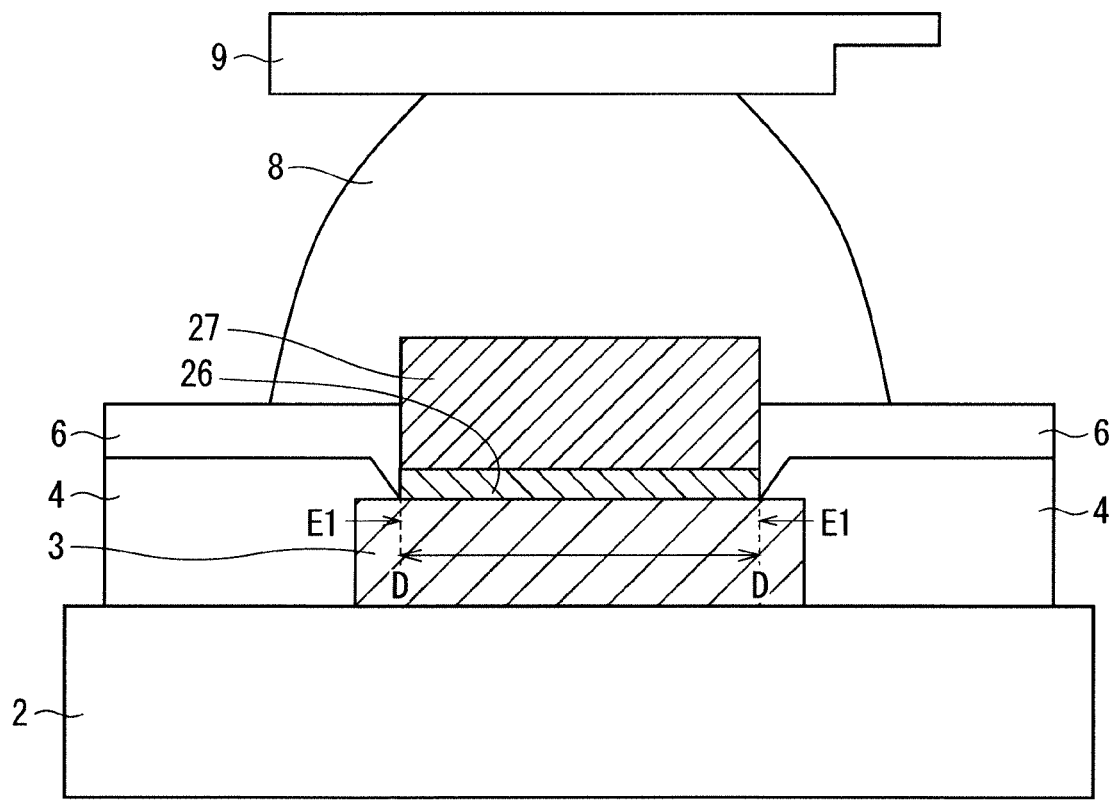
FIG. 12 is a cross-sectional view of a configuration of another power semiconductor device according to the third embodiment of the present invention.

It is noted that as a matter of course, the short-circuit withstanding capacity is improved not only by the structure of the power semiconductor device 25 illustrated in FIG. 11, but also by a structure in which the conductive paste is laminated throughout the active region, or by a structure in which the conductive paste is laminated so as to be exposed from the active region and to cover the terminal region in part or in whole. FIG. 12 illustrates a power semiconductor device 28 that includes a sintered metal layer formed by laminating a conductive paste throughout an active region and then sintering the conductive paste.

Figure 13:
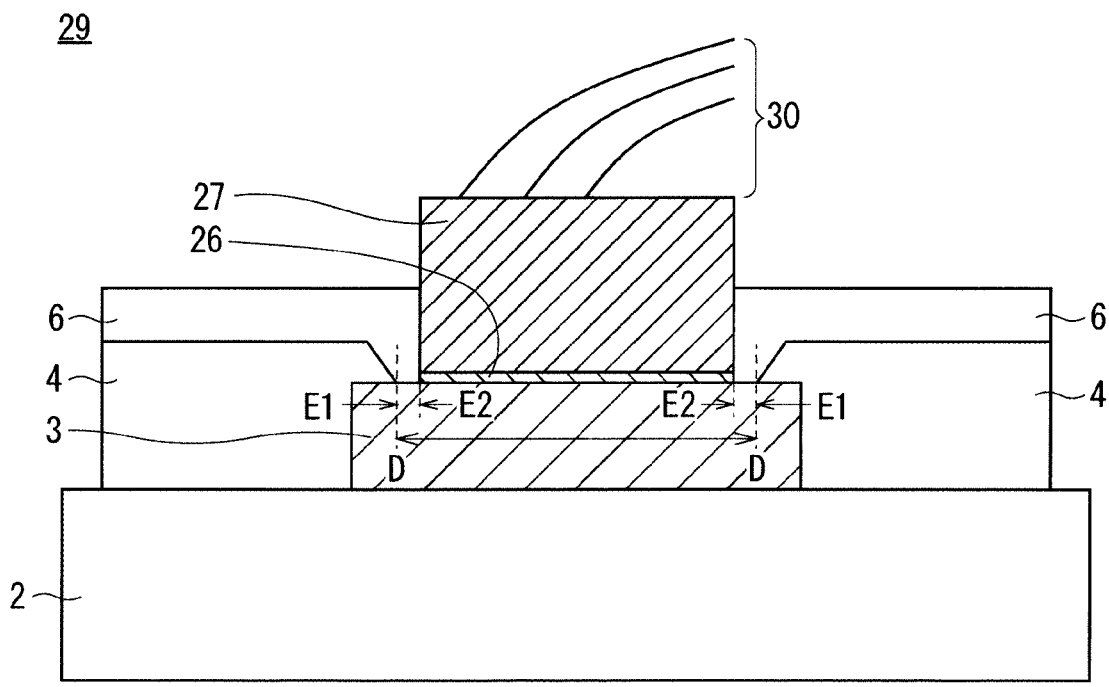
FIG. 13 is a cross-sectional view of a configuration of still another power semiconductor device according to the third embodiment of the present invention.

The power semiconductor device, although including the solder layer 8 and the busbar 9 in the above description, may be configured in any other manner. As illustrated in FIG. 13, a power semiconductor device 29 may include the sintered metal layer 27 connected to wires 30 through wire bonding. In this case, like the second embodiment, a conductive paste made of Cu is baked into the sintered metal layer 27, the conductive layer 26 made of Cu is formed through a process, such as screen printing or plating; moreover, each wire 30 is made of Cu.

Like the first embodiment, the IGBT 11 (c.f., FIG. 7) is mountable on the power semiconductor devices 25, 28, and 29. The sintered metal layer 27 disposed on the emitter electrode 3 brings the same effect that in the first embodiment (FIG. 5).

According to the third embodiment, a margin for forming the conductive layer 26 is freely set within a range that does not go beyond the thickness of the sintered metal layer 27. Further, two-time screen printing, which forms the conductive layer 26 and sintered metal layer 27 having the same width, facilitates the manufacture of a power semiconductor device when compared to the device manufacture in the first embodiment. Still further, the short-circuit withstanding capacity improves even if some patterns of the power semiconductor device or some methods for manufacturing the power semiconductor device prevent a sintered metal layer from being formed directly on the end of the emitter electrode 3.

Fourth Embodiment

Figure 14:
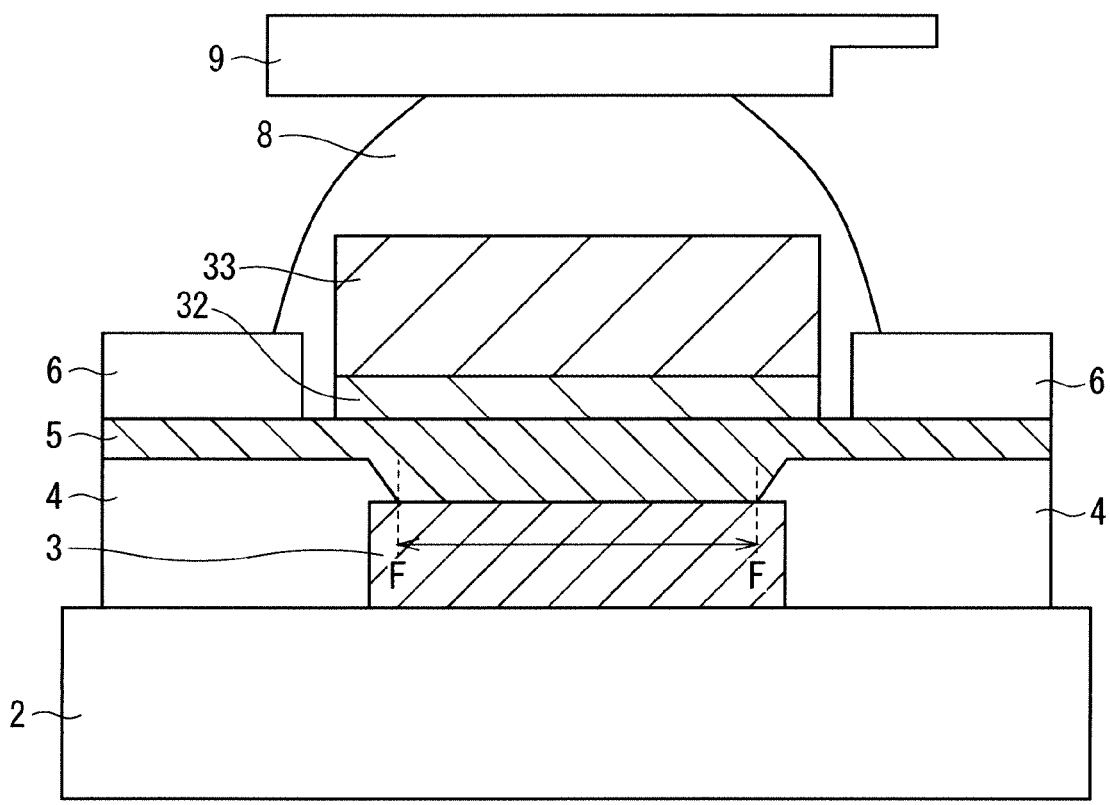
FIG. 14 is a cross-sectional view of a configuration of a power semiconductor device according to a fourth embodiment of the present invention.

FIG. 14 is a cross-sectional view of a configuration of a power semiconductor device 31 according to a fourth embodiment of the present invention. It is noted that a region indicated by line F-F (hereinafter referred to as an F-F region) is an active region of the emitter electrode 3 in FIG. 14.

As illustrated in FIG. 14, the power semiconductor device 31 according to the fourth embodiment includes two sintered metal layers 32 and 33 instead of the sintered metal layer 7, included in the power semiconductor device 1 according to the first embodiment. The other components, which are similar to those of the power semiconductor device 1 (c.f., FIG. 1) according to the first embodiment, will not be elaborated upon here.

The sintered metal layer 32 has lower porosity than the sintered metal layer 33. Porosity herein means the rate of voids in a sintered metal layer per unit volume. Low porosity means low density of voids in a sintered metal layer per unit volume. High porosity means high density of voids in a sintered metal layer per unit volume.

Sintered metal layers are less likely to have warpage than films formed through a process, such as plating or sputtering, but can have warpage when having a thickness of about 100 μm for instance. Meanwhile, a sintered metal layer in contact with the conductive layer 5 desirably has high adhesion in order to achieve high reliability. To satisfy this condition, the power semiconductor device in the fourth embodiment is configured such that the sintered metal layer 32 in contact with the conductive layer 5 has high adhesion and low porosity, and that the sintered metal layer 33 with high porosity is disposed on the sintered metal layer 32. In this way, the lamination of the two sintered metal layers 32 and 33 achieves high adhesion to the conductive layer 5. In addition, thick lamination of the sintered metal layers 32 and 33 enables low stress.

The following describes a method for manufacturing the power semiconductor device 31.

The emitter electrode 3 and the insulating layer 4 are formed onto a surface of the semiconductor substrate 2. At this stage, the emitter electrode 3 is formed onto an active region of the semiconductor substrate 2. In addition, the insulating layer 4 is formed onto a terminal region of the semiconductor substrate 2.

The conductive layer 5 made of Ni or Au is subsequently formed onto the active region of the emitter electrode 3 and the insulating layer 4. The polyimide layer 6 is subsequently formed in a position on the conductive layer 5, the position not overlapping the emitter electrode 3 in plan view.

Then, laminated onto the conductive layer 5 are, in sequence, a conductive paste made of low-porosity metal and a conductive paste made of high-porosity metal so as, in plan view, to be exposed from the end of the emitter electrode 3, to have a size to cover the emitter electrode 3, and not to be in contact with the polyimide layer 6. Each conductive paste needs to be formed through, for instance, screen printing with metal, such as Cu or Ag. The conductive paste made of low-porosity metal does not need to be thick, and may have a thickness of 1 μm or smaller.

The solder layer 8 is subsequently formed so as to cover the conductive pastes, the conductive layer 5, and part of the polyimide layer 6. It is noted that the solder layer 8 may be formed so as to cover all the polyimide layer 6.

The busbar 9 is finally joined onto the solder layer 8. Then, pressure application and heating are performed. At this stage, the conductive pastes are baked into sintered metal layers. To be specific, the conductive paste made of low-porosity metal is baked into the sintered metal layer 32; in addition, the conductive paste made of high-porosity metal is baked into the sintered metal layer 33. The solder layer 8 is melted to penetrate toward the laminated conductive paste made of high-porosity metal in the pressure application and heating processes. Hence, the pressure application and heating processes turn a portion of the sintered metal layer 33 in close contact with the solder layer 8 into an alloy of the solder layer 8 and the conductive paste made of high-porosity metal. Through these steps, the power semiconductor device 31 illustrated in FIG. 14 is completed.

It is noted that like the first embodiment, the IGBT 11 (c.f., FIG. 7) is mountable on the power semiconductor device 31.

The following describes an effect of the power semiconductor device 31 according to the fourth embodiment.

Figure 15:
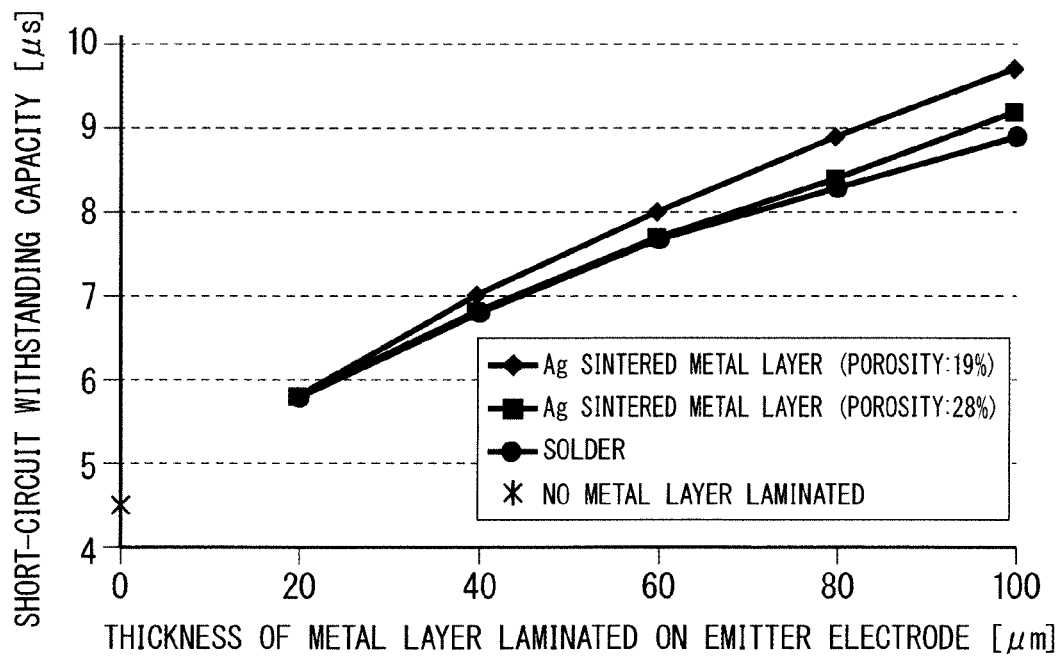
FIG. 15 is a graph showing a relationship between the thickness of the metal layer laminated on the emitter electrode and short-circuit withstanding capacity, according to the fourth embodiment of the present invention.

FIG. 15 illustrates a relationship between the thickness of each metal layer laminated on the emitter electrode 3 and the short-circuit withstanding capacity, and is a graph showing the results of a simulation using a calculator. FIG. 15 provides the following instances: the emitter electrode 3 is exposed to air (thermal capacity: 0.01 J/cm$^3$·K, heat conductivity: 0.0003 W/cm·K) as one example of no metal layer laminated thereon; a Ag sintered metal layer having a porosity of 19% (thermal capacity: 2.00 J/cm$^3$·K, heat conductivity: 2.4 W/cm·K) is disposed on the emitter electrode 3; a Ag sintered metal layer having a porosity of 28% (thermal capacity: 1.78 J/cm$^3$·K, heat conductivity: 1.1 W/cm·K) is disposed on the emitter electrode 3; and a solder layer (thermal capacity: 1.74 J/cm$^3$·K, heat conductivity: 0.64 W/cm·K) is disposed on the emitter electrode 3. The thicknesses of each metal layer laminated on the emitter electrode 3 are 20 μm, 40 μm, 60 μm, 80 μm, and 100 μm.

As seen from FIG. 15, the short-circuit withstanding capacity is 4.5 μs when no metal layer is laminated on the emitter electrode 3 (herein in the case of the air); moreover, greater thickness of each metal layer equates with higher short-circuit withstanding capacity when the metal layer is laminated on the emitter electrode 3.

A Ag sintered metal layer with a porosity of 28%, even when being thick, provides lower short-circuit withstanding capacity than a Ag sintered metal layer with a porosity of 19%. Reference is made to a thickness of 60 μm or less. The Ag sintered metal layer with a porosity of 28% provides short-circuit withstanding capacity equal to that in the solder layer. Reference is made to thicknesses of 80 μm and 100 μm. The Ag sintered metal layer with a porosity of 28% provides higher short-circuit withstanding capacity than the solder layer. Accordingly, the lamination of, in sequence, a low-porosity metal layer and a high-porosity metal layer achieves lower stress than the lamination of a low-porosity metal layer alone, and maintains the lower stress in the lamination of a higher-porosity metal having a greater thickness. This greatly increases the short-circuit withstanding capacity.

A comparison is made between the lamination of two Ag sintered metal layers having different porosities from each other and the lamination of a solder layer onto a single Ag sintered metal layer. The former, which contains similar kinds of metal, has smaller warpage. In other words, a laminate structure of a Ag sintered metal layer with a porosity of 28% disposed on a Ag sintered metal layer with a porosity of 19% provides higher short-circuit withstanding capacity than a laminate structure of a solder layer disposed on the Ag sintered metal layer with a porosity of 19%.

Although the foregoing takes a Ag sintered metal layer as an example, a Cu sintered metal layer brings a similar effect. As such, the lamination of a metal layer with high porosity onto a thin metal layer with low porosity reduces stress.

Such lamination also enables a thick metal layer with high porosity to be formed, thereby increasing the short-circuit withstanding capacity.

Although the forgoing refers to the lamination of two sintered metal layers, any number of sintered metal layers may be laminated. Three or more sintered metal layers can be laminated. The short-circuit withstanding capacity improves by laminating these sintered metal layers with different porosities from each other onto a conductive layer in ascending order of the porosities.

The laminate structure of the plural sintered metal layers is applicable to the power semiconductor devices 21, 25, 28, and 29 according to the second and third embodiments (FIGS. 10, 11, 12, and 13) as well as the power semiconductor device according to the first embodiment (FIG. 1).

Cu and Ag, contained in the sintered metal layers, have high heat conductivity and low stress. The power semiconductor device in the fourth embodiment includes the sintered metal layer 32 with low porosity and the sintered metal layer 33 with high porosity disposed on the sintered metal layer 32. This enhances adhesion between the sintered metal layer 32 and the conductive layer 5. Further, the sintered metal layer 33, if formed to be thick, maintains the low stress. This achieves sufficient thermal capacity, thereby improving heat dissipation performance. The sintered metal layers 32 and 33 are formed so as to completely cover the emitter electrode 3 in plan view. This enhances transitional heat-dissipation performance, thereby increasing the short-circuit withstanding capacity, a time period before the flow of an overcurrent resulting from thermal runaway when the power semiconductor device 31 is short-circuited. It is noted that to improve the short-circuit withstanding capacity for certain, the sintered metal layers 32 and 33 are desirably laminated throughout a surface directly on the active region of the emitter electrode 3 indicated by the F-F region in FIG. 14, because the short-circuit withstanding capacity is regulated in a location where the thermal runaway of current occurs at the earliest time.

The above embodiments of the present invention are illustrative and thus do not restrict the scope of the invention. These novel embodiments can be implemented in other various forms and can be thus omitted, replaced, and changed without departing from the gist of the invention. For instance, other than an IGBT, a semiconductor device, such as a MOSFET may be mounted on a power semiconductor device; in addition, a semiconductor substrate may be made of SiC or GaN other than Si. In particular, a SiC or GaN semiconductor having a wide bandgap, which needs to operate under higher temperature than a Si semiconductor, further increases a transitional heat-dissipation effect achieved by laminating sintered metal layers onto an emitter electrode.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

1 power semiconductor device, 2 semiconductor substrate, 3 emitter electrode, 4 insulating layer, 5 conductive layer, 6 polyimide layer, 7 sintered metal layer, 8 solder layer, 9 busbar, 10 conductive paste, 11 IGBT, 12 collector electrode, 13 p-type collector layer, 14 n-type buffer layer, 15 n-type drift layer, 16 p-type base layer, 17 n-type emitter layer, 18 gate oxide film, 19 trench gate, 20 interlayer insulating film, 21 power semiconductor device, 22 conductive layer, 23 sintered metal layer, 24 wire, 25 power semiconductor device, 26 conductive layer, 27 sintered metal layer, 28 power semiconductor device, 29 power semiconductor device, 30 wire, 31 power semiconductor device, 32, 33 sintered metal layer.

The invention claimed is:

1. A power semiconductor device comprising:
a surface electrode disposed on a semiconductor substrate and through which a main current flows;
a first metal layer that is disposed on the surface electrode and is not a sintered compact; and
at least one second metal layer that is disposed on the first metal layer and is a sintered compact,
wherein the second metal layer has a size to cover all the surface electrode in plan view, and has higher heat conductivity than the first metal layer,
wherein the first metal layer is wider in the plan view than the second metal layer, and
wherein the first metal layer is disposed between the second metal layer and the surface electrode.

2. The power semiconductor device according to claim 1, wherein the second metal layer has a size to be exposed from an end of the surface electrode in plan view.

3. The power semiconductor device according to claim 1, wherein the first metal layer has a size to cover all the surface electrode in plan view, and has a size to be exposed from an end of the surface electrode in plan view.

4. The power semiconductor device according to claim 1, wherein
the semiconductor substrate comprises an active region disposed on a surface of the semiconductor substrate, and a terminal region provided to surround the active region,
the power semiconductor device further comprises a polyimide layer disposed on the first metal layer in the terminal region of the semiconductor substrate, and
the polyimide layer is provided to be spaced from the second metal layer.

5. The power semiconductor device according to claim 1, further comprising a solder disposed over the second metal layer,
wherein the solder is joined also to the first metal layer.

6. The power semiconductor device according to claim 5, wherein the first metal layer contains Au at least at a joint between the first metal layer and the solder.

7. The power semiconductor device according to claim 1, further comprising a metal wire comprising one end joined on the second metal layer.

8. A power semiconductor device comprising:
a surface electrode disposed on a semiconductor substrate and through which a main current flows;
a first metal layer that is disposed on the surface electrode and is not a sintered compact; and
at least one second metal layer that is disposed on the first metal layer and is a sintered compact,
wherein the semiconductor substrate comprises an active region disposed on a surface of the semiconductor substrate, and a terminal region provided to surround the active region,
the first metal layer and the second metal layer each have a size to cover the active region in plan view, and the power semiconductor device further comprises a solder disposed over the second metal layer.

9. The power semiconductor device according to claim 8, wherein the first metal layer and the second metal layer have the same width in plan view.

10. The power semiconductor device according to claim 8, further comprising a polyimide layer disposed, in plan view, on the active region defined from a boundary between the active region and the terminal region to a position spaced from the boundary toward the active region by a distance smaller than or equal to a thickness of the second metal layer.

11. The power semiconductor device according to claim 8, wherein
the first metal layer contains Ni, Au, an alloy of Ni, or an alloy of Au, and
the second metal layer is formed of a Ag sintered compact or a Cu sintered compact.

12. The power semiconductor device according to claim 8, wherein
the at least one second metal layer comprises a plurality of second metal layers, and
the second metal layers have void densities per unit volume that are different from each other, and are laminated on the first metal layer in ascending order of the void densities per unit volume.

13. A power semiconductor device comprising:
a surface electrode disposed on a semiconductor substrate and through which a main current flows;
a first metal layer that is disposed on the surface electrode and is not a sintered compact; and
at least one second metal layer that is disposed on the first metal layer and is a sintered compact,
wherein the semiconductor substrate comprises an active region disposed on a surface of the semiconductor substrate, and a terminal region provided to surround the active region,
the first metal layer and the second metal layer each comprise an end corresponding, in plan view, to a position spaced from a boundary between the active region and the terminal region toward the active region by a distance smaller than or equal to a thickness of the second metal layer, and
the power semiconductor device further comprises a solder disposed over the second metal layer.

14. The power semiconductor device according to claim 13, wherein the first metal layer and the second metal layer have the same width in plan view.

15. The power semiconductor device according to claim 13, further comprising a polyimide layer disposed, in plan view, on the active region defined from the boundary between the active region and the terminal region to the position spaced from the boundary toward the active region by the distance smaller than or equal to the thickness of the second metal layer.

16. The power semiconductor device according to claim 13, wherein
the first metal layer contains Ni, Au, an alloy of Ni, or an alloy of Au, and
the second metal layer is formed of a Ag sintered compact or a Cu sintered compact.

17. The power semiconductor device according to claim 13, wherein
the at least one second metal layer comprises a plurality of second metal layers, and
the second metal layers have void densities per unit volume that are different from each other, and are laminated on the first metal layer in ascending order of the void densities per unit volume.

\* \* \* \* \*